United States Patent
Park et al.

(10) Patent No.: US 9,530,472 B1
(45) Date of Patent: Dec. 27, 2016

(54) DATA ALIGNMENT DEVICE

(71) Applicant: SK hynix Inc., Icheon-si, Gyeonggi-do (KR)

(72) Inventors: Min Su Park, Seoul (KR); Hong Gyeom Kim, Icheon-si (KR)

(73) Assignee: SK HYNIX INC., Icheon-Si (KR)

( * ) Notice: Subject to any disclaimer, the term of this patent is extended or adjusted under 35 U.S.C. 154(b) by 0 days.

(21) Appl. No.: 15/170,636

(22) Filed: Jun. 1, 2016

(30) Foreign Application Priority Data

Feb. 22, 2016 (KR) ........................ 10-2016-0020577

(51) Int. Cl.
*G11C 7/10* (2006.01)
*G11C 8/00* (2006.01)
*G11C 7/22* (2006.01)
*G11C 7/12* (2006.01)

(52) U.S. Cl.
CPC . *G11C 7/22* (2013.01); *G11C 7/10* (2013.01); *G11C 7/12* (2013.01)

(58) Field of Classification Search
CPC ........... G11C 8/00; G11C 8/08; G11C 7/1066; G11C 7/1093; G11C 7/1087; G11C 7/1012; G11C 11/4093; G11C 7/222; G11C 11/4076; G11C 7/10; G11C 11/4096
See application file for complete search history.

(56) References Cited

U.S. PATENT DOCUMENTS

| 7,450,442 | B2 | 11/2008 | Kang | |
| 7,975,162 | B2 | 7/2011 | Kim et al. | |
| 9,449,665 | B1* | 9/2016 | Kim | G11C 7/222 |
| 2012/0026806 | A1* | 2/2012 | Kwon | G11C 7/1078 365/189.07 |
| 2015/0063008 | A1* | 3/2015 | Moon | G11C 7/1087 365/154 |

* cited by examiner

*Primary Examiner* — Hien Nguyen
(74) *Attorney, Agent, or Firm* — William Park & Associates Ltd.

(57) ABSTRACT

A data alignment device includes a buffer configured to buffer a data strobe signal, output a data strobe pulse signal, and buffer inputted data, a latch configured to latch the data in correspondence to the data strobe pulse signal, a first delay configured to delay the data strobe pulse signal and output a delayed signal, a divider configured to divide the delayed signal at a time of activation of a division control signal and generate a plurality of divided signals, a control circuit configured to receive a command signal, a clock, the data strobe signal, and the plurality of divided signals, and control the division control signal for controlling an enable state of the divider, and an alignment circuit configured to align output data in correspondence to the plurality of divided signals.

20 Claims, 4 Drawing Sheets

DATA ALIGNMENT DEVICE

CROSS-REFERENCES TO RELATED APPLICATION

The present application claims priority under 35 U.S.C. §119(a) to Korean application number 10-2016-0020577, filed on Feb. 22, 2016, in the Korean Intellectual Property Office, which is incorporated herein by reference in its entirety.

BACKGROUND

1. Technical Field

Various embodiments generally relate to a data alignment device, and more particularly, to a technology capable of ensuring a margin of alignment data.

2. Related Art

With an increase in the degree of integration, semiconductor memory devices have been continuously improved in order to improve an operation speed thereof. There has emerged a so-called synchronous memory device capable of operating synchronously with a clock applied from an exterior of a memory chip in order to improve an operation speed thereof.

The first proposed device is a so-called SDR (single data rate) synchronous memory device that inputs and outputs one data through one data pin over one clock cycle from an exterior of the memory device synchronously with a rising edge of the clock. However, the SDR synchronous memory device is not sufficient for satisfying the speed of a system requiring a high speed operation.

Particularly, a data processing speed of a central processing unit (CPU) has gradually increased and a system for supporting multi-media has increased. In a semiconductor memory device, there have been continued attempts for increasing a bandwidth of a synchronous memory device with an increase in the degree of integration and improving an operation speed of the semiconductor memory device.

In this regard, there has been proposed a DDR (double data rate) synchronous memory device that processes two pieces of data in one clock cycle. Through each data input/output pin of the DDR synchronous memory device, two pieces of data are continuously inputted/outputted in synchronization with a rising edge and a falling edge of a clock inputted from an exterior.

Accordingly, since the DDR synchronous memory device may ensure a bandwidth of more than twice a minimum without increasing a frequency of a clock as compared with the conventional SDR synchronous memory device, a high speed operation may be performed.

A data strobe signal used in a data write operation of the DDR synchronous memory device is called a write data strobe signal (WDQS). The write data strobe signal (WDQS) substantially maintains a low level state in advance before a predetermined clock cycle (for example, one clock cycle (1tCK)) in which data is inputted. The write data strobe signal (WDQS), which is subject to clocking in response to a time at which data is inputted, substantially maintains a low level state during the predetermined clock cycle after all pieces of data are inputted, and transitions to a high level state.

The tCK is a unit indicating a clock cycle. Data, which is inputted by matching a set-up time and a hold time with one write data strobe signal (WDQS) inputted from an exterior, is stored in the DDR synchronous memory device.

SUMMARY

Various embodiments are directed to adjust a division timing of a data strobe signal and ensure a margin of aligned internal data.

A data alignment device according to various embodiments includes: a buffer configured to buffer a data strobe signal, output a data strobe pulse signal, and buffer inputted data; a latch configured to latch the data in correspondence to the data strobe pulse signal; a first delay configured to delay the data strobe pulse signal and output a delayed signal; a divider configured to divide the delayed signal at a time of activation of a division control signal and generate a plurality of divided signals; a control circuit configured to receive a command signal, a clock, the data strobe signal, and the plurality of divided signals, and control the division control signal for controlling an enable state of the divider; and an alignment circuit configured to align output data in correspondence to the plurality of divided signals.

Embodiments have the following effects.

First, a divider for dividing a data strobe signal is controlled, so that an internal data margin may be ensured.

Second, noise may be substantially prevented from being inputted to the divider.

Third, output of a data strobe buffer is directly latched before being divided, so that a set-up/hold timing margin of data and the data strobe signal may be ensured.

DETAILED DESCRIPTION

Hereinafter, a data alignment device will be described below with reference to the accompanying drawings through various examples of embodiments.

Figure 1:
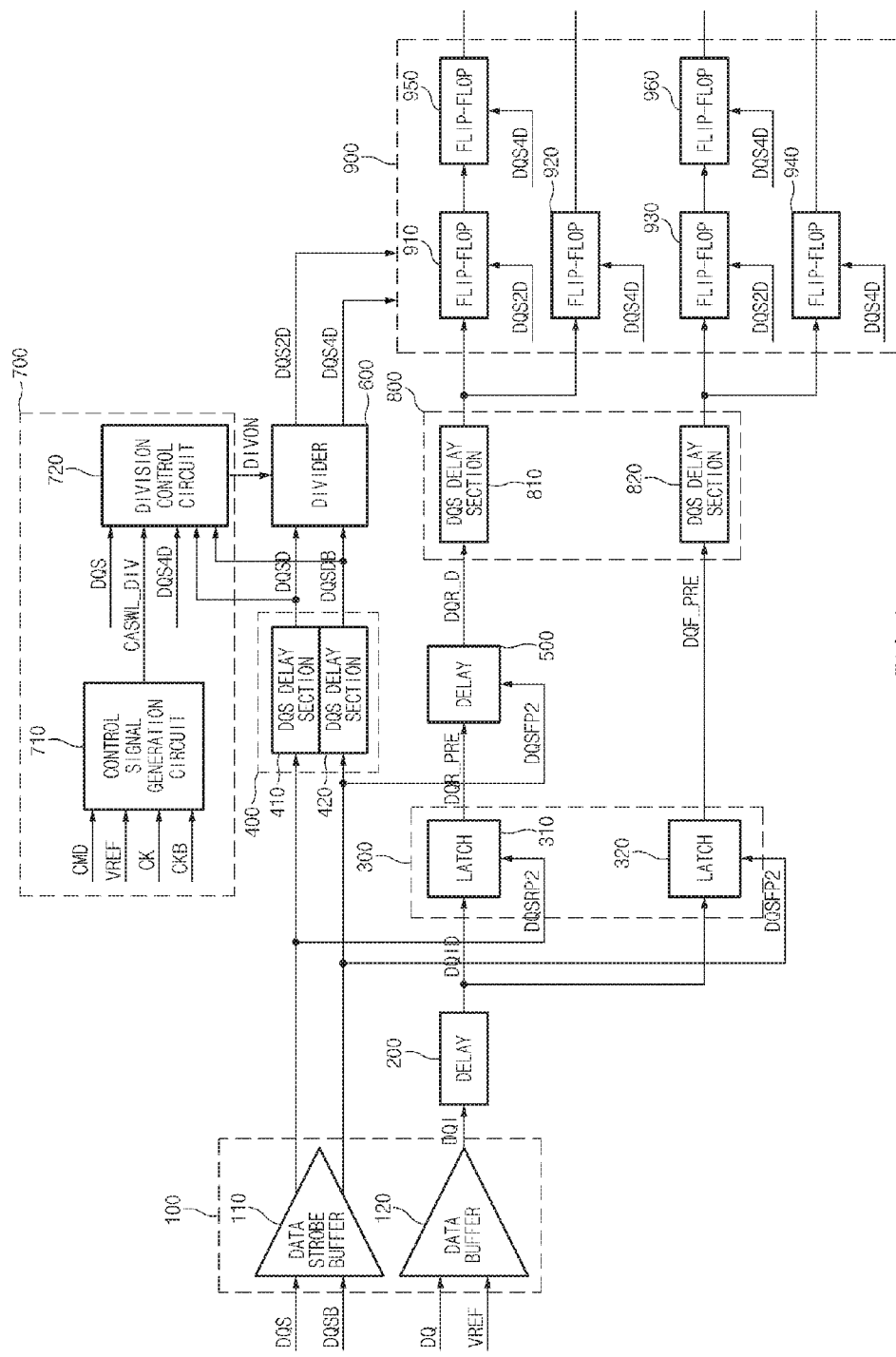
FIG. 1 is a configuration diagram of a data alignment device according to an embodiment.

FIG. 1 is a configuration diagram of a data alignment device according to an embodiment.

The embodiment includes a buffer 100, delays 200, 400, 500, and 800, a latch 300, a divider 600, a control circuit 700, and an alignment circuit 900.

The buffer 100 buffers at least one data strobe signal DQS and DQSB, data DQ, and a reference voltage VREF, and outputs at least one data strobe pulse signal DQSRP2 and DQSFP2 and data DQI. Such a buffer 100 includes a data strobe buffer 110 and a data buffer 120.

The data strobe buffer 110 buffers at least one data strobe signal DQS and DQSB and outputs the data strobe pulse signals DQSRP2 and DQSFP2. The data strobe signal DQSB is an inversion signal of the data strobe signal DQS. The data strobe pulse signal DQSRP2 is a signal synchronized with a rising edge of a clock. The data strobe pulse signal DQSFP2 is a signal synchronized with a falling edge of the clock. The data buffer 120 compares the data DQ with the reference voltage VREF, buffers a comparison result, and outputs the data DQI.

In a DDR synchronous memory device, in order to obtain an exact timing of data input/output, when data is received, a data strobe signal DQS is inputted. That is, in order to satisfy requirements for a data set-up time and a hold time in a destination, the data strobe signal DQS is inputted to a central processing unit (CPU) or a memory controller outside the memory device together with the data DQ.

Then, delay 200 delays the data DQI for a predetermined time and outputs delayed data DQID to the latch 300. The delay 200 delays set-up/hold times of the data DQI from the data buffer 120 and outputs a delay time to the latch 300. The delay time of the delay 200 may be set to be shorter than delay times of the delay 400 and the delay 800.

Furthermore, the latch 300 latches the delayed data DQID in correspondence to at least one data strobe pulse signal DQSRP2 and DQSFP2. The latch 300 includes a latch 310 and a latch 320. The latch 310 latches the delayed data DQID in synchronization with the data strobe pulse signal DQSRP2 and outputs rising data DQR_PRE. The latch 320 latches the delayed data DQID in synchronization with the data strobe pulse signal DQSFP2 and outputs falling data DQF_PRE.

In the embodiment, the latch 300 is not strobed by the divided data strobe signal DQS, but is strobed by the data strobe pulse signals DQSRP2 and DQSFP2 differentially amplified in the data strobe buffer 110. Consequently, in the embodiment, paths of the data strobe signal DQS and the data DQ are minimized to ensure a margin of the set-up/hold times, so that it is possible to substantially prevent a data transfer path from deteriorating.

The delay 400 delays the data strobe pulse signals DQSRP2 and DQSFP2 and outputs delayed signals DQSD and DQSDB. The delayed signal DQSDB is an inversion signal of the delayed signal DQSD.

Such a delay 400 includes a DQS delay section 410 and a DQS delay section 420. The DQS delay section 410 delays the data strobe pulse signal DQSRP2 and outputs the delayed signal DQSD. The DQS delay section 420 delays the data strobe pulse signal DQSFP2 and outputs the delayed signal DQSDB.

Then, the delay 500 delays the rising data DQR_PRE in correspondence to a falling pulse of the data strobe pulse signal DQSFP2, and outputs delayed data DQR_D. The delay 500 may include a D flip-flop that flip-flops the rising data DQR_PRE in synchronization with a clock of the data strobe pulse signal DQSFP2.

The divider 600 divides at least one of the delayed signals DQSD and DQSDB and outputs divided signals DQS2D and DQS4D at the time of activation of a division control signal DIVON. In order to ensure an internal margin of the aligned data DQ in the data strobe signal DQS, the data strobe signal DQS is divided for use.

For example, at the time of the activation of the division control signal DIVON, the divider 600 may output divided signals obtained by dividing at least one of the delayed signals DQSD and DQSDB by N (N is a natural number, for example, N=4). That is, the divider 600 may 4-divide the delayed signals DQSD and DQSDB and use the 2-divided signal DQS2D and the 4-divided signal DQS4D of the signals.

In the embodiment, one example, in which the divider 600 outputs 4-divided signals, has been described; however, the embodiment is not limited thereto and the number of divided signals and the phases of the divided signals are not limited.

However, when the data strobe signal DQS is divided, the divider 600 may abnormally operate due to noise applied from an exterior. Then, by the divider 600, a skew may occur between the data DQ and the data strobe signal DQS.

That is, in an initial operation, all the data strobe signals DQS and DQSB substantially maintain a high level. Then, a write command is applied, and the data strobe signals DQS and DQSB operate at a differential level after a write latency time-a preamble time (a mode register setting time) passes. A level difference of the data strobe signals DQS and DQSB is amplified through the data strobe buffer 110, so that they are used as signals for strobing the data DQ applied from an exterior.

However, when the data strobe signals DQS and DQSB have not been terminated to a high level, if noise is introduced, a slight level difference occurs in the data strobe signals DQS and DQSB. Then, noise is amplified through the data strobe buffer 110 and an abnormal data strobe signal DQS is generated.

As the speed of a semiconductor device gradually increases, a structure of dividing the data strobe signal DQS through the divider 600 is used in order to overcome a speed limitation. Accordingly, noise is introduced into the data strobe signals DQS and DQSB in a termination state. Then, an abnormal glitch occurs in the data strobe signal DQS due to the noise, so that the divider 600 may abnormally operate.

Accordingly, in the embodiment, division control circuit 720 of the control circuit 700 substantially prevents the divider 600 from being turned on until a write command is applied. Furthermore, only when the division control signal DIVON is activated, the divider 600 is allowed to operate through the control circuit 700, so that it is possible to substantially prevent noise from being applied to the divider 600 from an exterior.

When a latency signal CASWL_DIV is disabled and the divided signal DQS4D (the final data strobe signal) is enabled, since the division control signal DIVON is disabled, the divider 600 does not operate.

Furthermore, the control circuit 700 receives a command signal CMD, the reference voltage VREF, at least one clock CK and CKB, the data strobe signal DQS, the at least one divided signal DQS4D, and the delayed signals DQSD and DQSDB, and controls the division control signal DIVON for controlling an enable signal of the divider 600. Such a control circuit 700 includes a control signal generation circuit 710 and a division control circuit 720.

The control signal generation circuit 710 generates a latency signal CASWL_DIV indicating CAS write latency information in correspondence to the command signal CMD, the reference voltage VREF, and at least one clock CK and CKB. Then, the division control circuit 720 outputs the division control signal DIVON in correspondence to the data strobe signal DQS, the divided signal DQS4D, the latency signal CASWL_DIV, and the delayed signals DQSD and DQSDB.

The delay 800 delays the delayed data DQR_D to output rising data and delays the falling data DQF_PRE of the latch 300. Such a delay 800 includes a DQ delay section 810 and a DQ delay section 820. The DQ delay section 810 delays the delayed data DQR_D to output rising data delayed for a predetermined time. The DQ delay section 820 delays the falling data DQF_PRE for a predetermined time. A delay time of the delay 800 may be set to be longer than that of the delay 200.

A delay time of the delay 400 may be set to be substantially equal to that of the control signal generation circuit 710. Accordingly, the alignment circuit 900 strobes signals by the output of the divider 600 controlled by the control circuit 700. Thus, in order to synchronize operation timings of the data strobe signal DQS and the data DQ with each other, a delay time of the delay 800 may be set to be substantially equal to that of the delay 400.

The alignment circuit 900 aligns output data of the delay 800 in correspondence to the divided signals DQS2D and DQS4D. For example, the alignment circuit 900 may align the output data to 4-bit parallel data.

Since the alignment circuit 900 is strobed by the 2-divided signal DQS2D and the 4-divided signal DQS4D, a valid window of data may be increased. For example, in the embodiment, data may be aligned to have a 2-clock valid window.

Such an alignment circuit 900 includes a plurality of flip-flops 910, 920, 930, 940, 950, and 960. Each of the plurality of flip-flops 910, 920, 930, 940, 950, and 960 may include a D flip-flop that flip-flops the output data of the delay 800 in synchronization with the divided signal DQS2D or DQS4D.

The flip-flop 910 flip-flops the rising data output of the DQ delay section 810 in synchronization with the divided signal DQS2D. The flip-flop 920 flip-flops the rising data output of the DQ delay section 810 in synchronization with the divided signal DQS4D.

The flip-flop 930 flip-flops the falling data output of the DQ delay section 820 in synchronization with the divided signal DQS2D. The flip-flop 940 flip-flops the falling data output of the DQ delay section 820 in synchronization with the divided signal DQS4D.

The flip-flop 950 flip-flops the output of the flip-flop 910 in synchronization with the divided signal DQS4D. The flip-flop 960 flip-flops the output of the flip-flop 930 in synchronization with the divided signal DQS4D.

In the embodiment, the alignment circuit 900 uses the divided signal DQS2D or DQS4D of the divider 600 in an operation of aligning the output data of the delay 800. Accordingly, in the embodiment, a window of internal data is widened several times (for example, twice) and is aligned.

Figure 2:
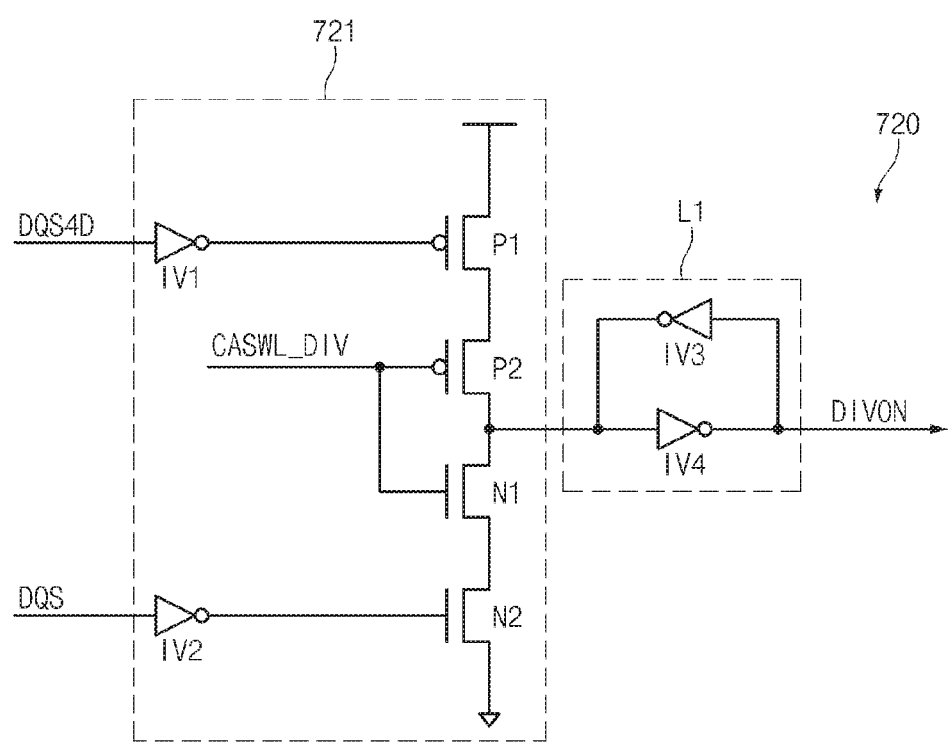
FIG. 2 is a detailed circuit diagram of a division control circuit of FIG. 1.

FIG. 2 is a detailed circuit diagram of the division control circuit 720 of FIG. 1.

The division control circuit 720 controls the state of the division control signal DIVON in correspondence to the data strobe signal DQS, the divided signal DQS4D, and the latency signal CASWL_DIV. The division control circuit 720 controls the division control signal DIVON by using the divided signal DQS4D of the signals obtained by dividing the delayed signals DQSD and DQSDB.

Such a division control circuit 720 includes a driving circuit 721 and a latch L1. The driving circuit 721 drives the latency signal CASWL_DIV to a power supply voltage level or a ground voltage level by the data strobe signal DQS and the divided signal DQS4D. Such a driving circuit 721 includes a plurality of inverters IV1 and IV2, a plurality of PMOS transistors P1 and P2, and a plurality of NMOS transistors N1 and N2.

The plurality of PMOS transistors P1 and P2 and the plurality of NMOS transistors N1 and N2 are serially coupled between a power supply voltage terminal or a ground voltage terminal. The PMOS transistor P1 receives the divided signal DQS4D inverted by the inverter IV1 through a gate terminal thereof. The PMOS transistor P2 and the NMOS transistor N1 receive the latency signal CASWL_DIV through a common gate terminal thereof. Furthermore, the NMOS transistor N2 receives the data strobe signal DQS inverted by the inverter IV2 through a gate terminal thereof.

The latch L1 includes inverters IV3 and IV4 coupled through a latch structure. Such a latch L1 latches the output of the driving circuit 721 and outputs the division control signal DIVON.

After the write command is applied, when a write latency time-a preamble time (a mode register setting time 1tCK/2tCK) is reached, the data strobe signals DQS and DQSB are enabled. Accordingly, after the write command signal is applied, the latency signal CASWL_DIV delayed by the write latency time—the preamble time is generated.

When the data strobe signal DQS and the divided signal DQS4D are at a low level and the latency signal CASWL_DIV is at a high level, the division control signal DIVON is at a high level, so that the divider 600 operates. However, when the data strobe signal DQS and the divided signal DQS4D are at a high level and the latency signal CASWL_DIV is at a low level, the division control signal DIVON is at a low level, so that the divider 600 does not operate.

That is, the division control circuit 720 operates by the data strobe signal DQS, and the division control signal DIVON is reset by the divided signal DQS4D which is the final (for example, fourth) data strobe signal.

Figure 3:
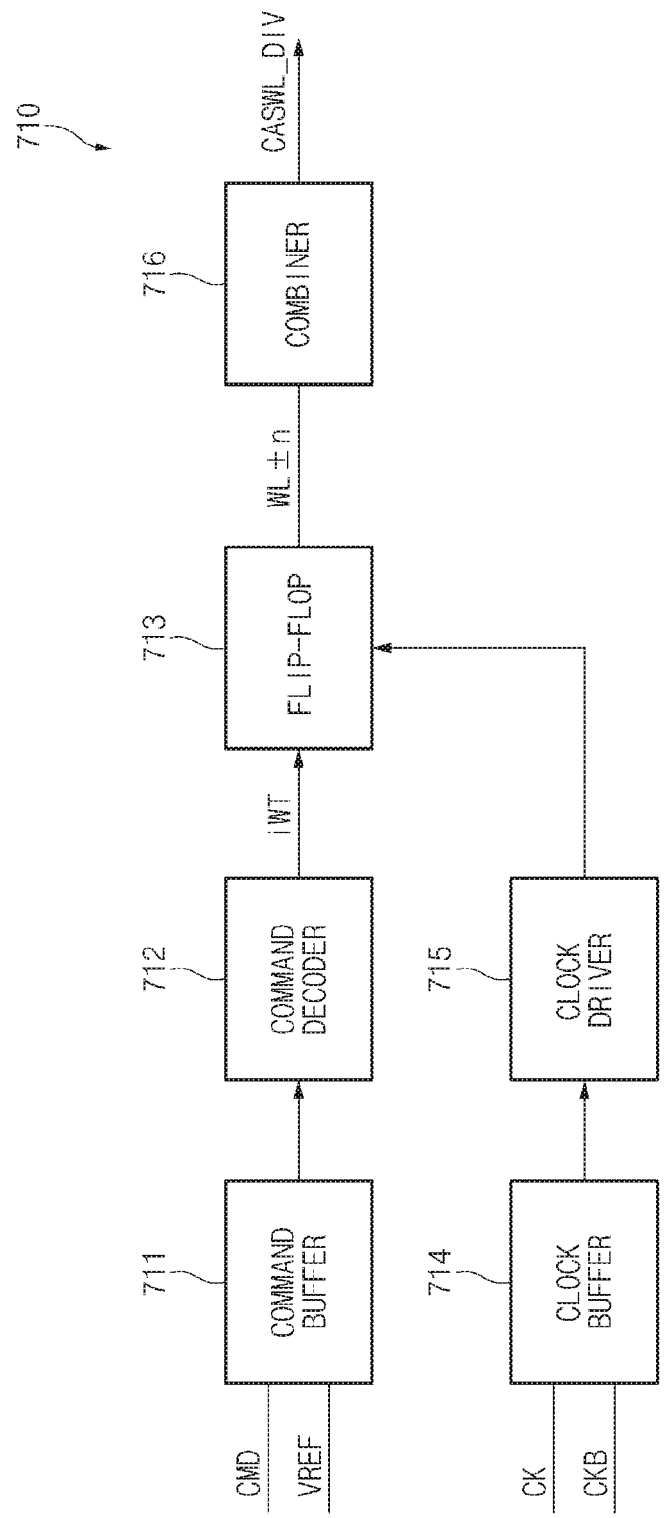
FIG. 3 is a detailed circuit diagram of a control signal generation circuit of FIG. 1.

FIG. 3 is a detailed circuit diagram of the control signal generation circuit 710 of FIG. 1.

The control signal generation circuit 710 outputs the latency signal CASWL_DIV indicating the CAS write latency information in correspondence to the command signal CMD, the reference voltage VREF, and the clocks CK and CKB. The clock CKB is an inversion clock of the clock CK.

Such a control signal generation circuit 710 includes a command buffer 711, a command decoder 712, a flip-flop 713, a clock buffer 714, a clock driver 715, and a combiner 716.

The command buffer 711 buffers the command signal CMD in correspondence to the reference voltage VREF and outputs a buffered signal to the command decoder 712. The command decoder 712 decodes the signal applied from the command buffer 711 and outputs a write signal iWT.

The flip-flop 713 flip-flops the write signal iWT in correspondence to the output of the clock driver 715, and outputs a plurality of write latency signals WL. Such a flip-flop 713 outputs the write latency signals WL when a time ±n (a preamble time) passes from the write latency time after the write signal iWT is activated.

The flip-flop 713 may include a plurality of D flip-flops coupled in a serial chain structure. The time ±n may be changed according to the number of flip-flops included in the flip-flop 713.

As described above, the flip-flop 713 outputs the write latency signals WL in correspondence to the write signal iWT. The combiner 716 controls the latency signal CASWL_DIV by the write latency signals WL, so that the divided signals of the divider 600 may be sequentially outputted in synchronization with the write signal iWT.

Furthermore, the clock buffer 714 buffers the clocks CK and CKB and outputs a buffered clock to the clock driver 715. The clock driver 715 drives the clock applied from the clock buffer 714 and outputs a driven clock to the flip-flop 713.

The combiner 716 combines the plurality of write latency signals WL with one another and outputs the latency signal CASWL_DIV. That is, the combiner 716 combines respective output of the plurality of flip-flops included in the flip-flop 713 with one another, thereby generating the latency signal CASWL_DIV.

After the write signal iWT (the output of the command decoder 712) is activated, the write latency signals WL are activated during the delay time of the flip-flop 713. Then, the combiner 716 activates the latency signal CASWL_DIV after delay during a combination time of the plurality of write latency signals WL.

That is, a time for which the command decoder 712 recognizes a write command and activates the write signal iWT is indicated by T1. Furthermore, a time for which the write latency signals WL are delayed in the circuit logic of the flip-flop 713 is indicated by T2. A time for which the combiner 716 combines the write latency signals WL with one another and outputs the latency signal CASWL_DIV is indicated by T3.

Then, a time for which the DQS delay sections 410 and 420 of the delay 400 respectively delay the data strobe pulse signals DQSRP2 and DQSFP2 is T1+T2+T3. That is, the DQS delay sections 410 and 420 are also allowed to have delay times by the delay time of the control signal generation circuit 710, so that the control timings of the data strobe signal DQS and the command signal CMD may be synchronized with each other. The DQS delay sections 410 and 420 delay the data strobe pulse signals DQSRP2 and DQSFP2 by a time obtained by delaying the command signal CMD.

While various embodiments have been described above, it will be understood to those skilled in the art that the embodiments described are by way of example only. Accordingly, the data alignment device described herein should not be limited based on the described embodiments.

Figure 4:
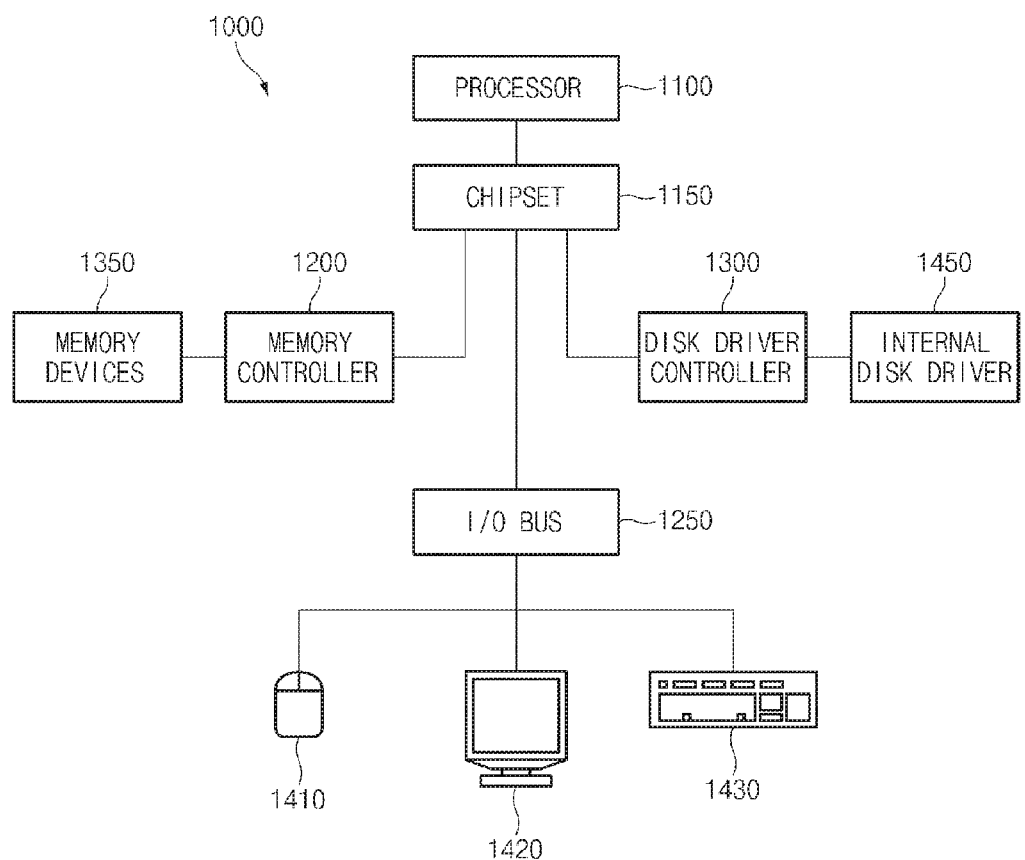
FIG. 4 illustrates a block diagram of a system employing a semiconductor device in accordance with the various embodiments discussed above with relation to FIGS. 1-3.

The semiconductor devices and/or a data alignment device discussed above (see FIGS. 1-3) are particularly useful in the design of memory devices, processors, and computer systems. For example, referring to FIG. 4, a block diagram of a system employing a semiconductor device and/or a data alignment device discussed in accordance with the various embodiments are illustrated and generally designated by a reference numeral 1000. The system 1000 may include one or more processors (i.e., Processor) or, for example but not limited to, central processing units ("CPUs") 1100. The processor (i.e., CPU) 1100 may be used individually or in combination with other processors (i.e., CPUs). While the processor (i.e., CPU) 1100 will be referred to primarily in the singular, it will be understood by those skilled in the art that a system 1000 with any number of physical or logical processors (i.e., CPUs) may be implemented.

A chipset 1150 may be operably coupled to the processor (i.e., CPU) 1100. The chipset 1150 is a communication pathway for signals between the processor (i.e., CPU) 1100 and other components of the system 1000. Other components of the system 1000 may include a memory controller 1200, an input/output ("I/O") bus 1250, and a disk driver controller 1300. Depending on the configuration of the system 1000, any one of a number of different signals may be transmitted through the chipset 1150, and those skilled in the art will appreciate that the routing of the signals throughout the system 1000 can be readily adjusted without changing the underlying nature of the system 1000.

As stated above, the memory controller 1200 may be operably coupled to the chipset 1150. The memory controller 1200 may include at least one semiconductor device and/or a data alignment device as discussed above with reference to FIGS. 1-3. Thus, the memory controller 1200 can receive a request provided from the processor (i.e., CPU) 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one semiconductor device and/or a data alignment device as discussed above with relation to FIGS. 1-3, the memory devices 1350 may include a plurality of word lines and a plurality of bit lines for defining a plurality of memory cells. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420, and 1430. The I/O devices 1410, 1420, and 1430 may include, for example but are not limited to, a mouse 1410, a video display 1420, or a keyboard 1430. The I/O bus 1250 may employ any one of a number of communications protocols to communicate with the I/O devices 1410, 1420, and 1430. In an embodiment, the I/O bus 1250 may be integrated into the chipset 1150.

The disk driver controller 1300 may be operably coupled to the chipset 1150. The disk driver controller 1300 may serve as the communication pathway between the chipset 1150 and one internal disk driver 1450 or more than one internal disk driver 1450. The internal disk driver 1450 may facilitate disconnection of the external data storage devices by storing both instructions and data. The disk driver controller 1300 and the internal disk driver 1450 may communicate with each other or with the chipset 1150 using virtually any type of communication protocol, including, for example but not limited to, all of those mentioned above with regard to the I/O bus 1250.

It is important to note that the system 1000 described above in relation to FIG. 4 is merely one example of a system 1000 employing a semiconductor device and/or a data alignment device as discussed above with relation to FIGS. 1-3. In alternate embodiments, such as, for example but not limited to, cellular phones or digital cameras, the components may differ from the embodiments illustrated in FIG. 4.

What is claimed is:

1. A data alignment device comprising:
   a buffer configured to buffer a data strobe signal, output a data strobe pulse signal, and buffer inputted data;
   a latch configured to latch the data in correspondence to the data strobe pulse signal;
   a first delay configured to delay the data strobe pulse signal and output a delayed signal;
   a divider configured to divide the delayed signal at a time of activation of a division control signal and generate a plurality of divided signals;
   a control circuit configured to receive a command signal, a clock, the data strobe signal, and the plurality of divided signals, and control the division control signal for controlling an enable state of the divider; and
   an alignment circuit configured to align output data in correspondence to the plurality of divided signals.

2. The data alignment device of claim 1, wherein the buffer comprises:
   a data strobe buffer configured to buffer the data strobe signal and output a first data strobe pulse signal and a second data strobe pulse signal, which have phases opposite to each other; and a data buffer configured to compare the data with a reference voltage and buffer a comparison result.

3. The data alignment device of claim 1, further comprising:
a second delay configured to delay set-up/hold times from output of the buffer and output a delay time to the latch.

4. The data alignment device of claim 3, wherein the second delay has a delay time shorter than a delay time of the first delay.

5. The data alignment device of claim 1, wherein the latch comprises:
a first latch configured to latch the data in synchronization with the first data strobe pulse signal and output rising data; and
a second latch configured to latch the data in synchronization with the second data strobe pulse signal and output falling data.

6. The data alignment device of claim 1, further comprising:
a third delay configured to delay rising data of the latch in correspondence to a falling pulse of the data strobe pulse signal, and output delayed data.

7. The data alignment device of claim 6, wherein the third delay includes a D flip-flop.

8. The data alignment device of claim 1, wherein the first delay comprises:
a first DQS delay section configured to delay the first data strobe pulse signal; and
a second DQS delay section configured to delay the second data strobe pulse signal which is an inversion signal of the first data strobe pulse signal.

9. The data alignment device of claim 1, wherein the control circuit comprises:
a control signal generation circuit configured to output a latency signal indicating CAS write latency information in correspondence to the command signal, the clock, and a reference voltage; and
a division control circuit configured to receive the data strobe signal, the latency signal, and a final divided signal of the plurality of divided signals, and output the division control signal.

10. The data alignment device of claim 9, wherein, when the latency signal is disabled and a divided signal (a final data strobe signal) is enabled, the division control circuit disables the division control signal.

11. The data alignment device of claim 9, wherein the control signal generation circuit comprises:
a command buffer configured to buffer a command signal in correspondence to the reference voltage;
a command decoder configured to decode a signal applied from the command buffer and output a write signal;
a flip-flop configured to flip-flop the write signal in correspondence to the clock and output a plurality of write latency signals; and a combiner configured to combine the plurality of write latency signals with one another and output the latency signal.

12. The data alignment device of claim 11, wherein the control signal generation circuit outputs the write latency signal when a time ±n (a preamble time) passes from a write latency time after the write signal is activated.

13. The data alignment device of claim 9, wherein a delay time of the control signal generation circuit is set to be substantially equal to a delay time of the first delay.

14. The data alignment device of claim 9, wherein the division control circuit comprises:
a driving circuit configured to drive the latency signal in correspondence to the data strobe signal and the final divided signal; and
a latch configured to latch output of the driving circuit and output the division control signal.

15. The data alignment device of claim 1, further comprising:
a fourth delay configured to delay the output data of the latch and output delayed data to the alignment circuit.

16. The data alignment device of claim 15, wherein the fourth delay comprises:
a first DQ delay section configured to delay rising data, which is applied from the latch, for a predetermined time; and
a second DQ delay section configured to delay falling data, which is applied from the latch, for a predetermined time.

17. The data alignment device of claim 15, wherein a delay time of the fourth delay is set to be substantially equal to a delay time of the first delay.

18. The data alignment device of claim 1, wherein the alignment circuit includes a plurality of D flip-flops which are strobed by some of the plurality of divided signals.

19. The data alignment device of claim 1, wherein the alignment circuit comprises:
a first flip-flop configured to flip-flop rising data by a second divided signal of the plurality of divided signals;
a second flip-flop configured to flip-flop output of the first flip-flop by a fourth divided signal of the plurality of divided signals; and
a third flip-flop configured to flip-flop the rising data by the second divided signal.

20. The data alignment device of claim 1, wherein the alignment circuit comprises:
a fourth flip-flop configured to flip-flop falling data by a second divided signal of the plurality of divided signals;
a fifth flip-flop configured to flip-flop output of the fourth flip-flop by a fourth divided signal of the plurality of divided signals; and
a sixth flip-flop configured to flip-flop the falling data by the second divided signal.

* * * * *